(12) United States Patent
Fan et al.

(10) Patent No.: US 11,611,262 B2
(45) Date of Patent: Mar. 21, 2023

(54) DYNAMIC NAMEPLATE (71) Applicant: AURAS TECHNOLOGY CO., LTD., New Taipei (TW)

(72) Inventors: Mu-Shu Fan, New Taipei (TW); Chien-Chih Su, New Taipei (TW); Kuan-Cheng Lu, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 131 days.

(21) Appl. No.: 17/117,329

(22) Filed: Dec. 10, 2020

(65) Prior Publication Data

US 2021/0367479 A1 Nov. 25, 2021

(30) Foreign Application Priority Data

May 25, 2020 (TW) .................................. 109117347

(51) Int. Cl.
| H02K 1/14 | (2006.01) |
| H02K 7/116 | (2006.01) |
| H02K 7/08 | (2006.01) |
| G09F 3/02 | (2006.01) |
| G09F 3/08 | (2006.01) |
| H02K 3/18 | (2006.01) |
| H05K 1/02 | (2006.01) |

(52) U.S. Cl.
CPC ............... *H02K 7/116* (2013.01); *G09F 3/02* (2013.01); *G09F 3/08* (2013.01); *H02K 1/14* (2013.01); *H02K 3/18* (2013.01); *H02K 7/08* (2013.01); *H05K 1/0266* (2013.01); *H05K 2201/1009* (2013.01)

(58) Field of Classification Search
CPC .. H02K 1/14; H02K 3/18; H02K 7/08; H02K 7/116; H02K 2211/03
See application file for complete search history.

(56) References Cited

U.S. PATENT DOCUMENTS

| 5,006,745 | A | * | 4/1991 | Nishio | .................... | H02K 29/03 |
| | | | | | | 310/67 R |
| 6,274,955 | B1 | * | 8/2001 | Satoh | .................... | H05K 1/0269 |
| | | | | | | 310/71 |
| 7,388,311 | B2 | * | 6/2008 | Bhargava | ............... | H02K 1/278 |
| | | | | | | 310/198 |
| 7,659,649 | B2 | * | 2/2010 | Lin | ........................ | H02K 7/085 |
| | | | | | | 310/67 R |
| 9,318,926 | B2 | * | 4/2016 | Dajaku | ..................... | H02K 3/28 |
| 9,725,840 | B2 | * | 8/2017 | Choi | ........................ | D06F 23/04 |
| 2007/0290582 | A1 | * | 12/2007 | Han | ........................ | H02K 11/33 |
| | | | | | | 310/68 B |

* cited by examiner

*Primary Examiner* — Dang D Le
(74) *Attorney, Agent, or Firm* — Amin, Turocy & Watson, LLP (57) ABSTRACT A dynamic nameplate is provided, which includes: a base disposed on a circuit board; and a rotating member disposed on the base through a bearing, so that the rotating member can rotate relative to the base. The dynamic nameplate can provide dynamic effects without using a conventional motor.

6 Claims, 9 Drawing Sheets

DYNAMIC NAMEPLATE

BACKGROUND

1. Technical Field

The present disclosure relates to a nameplate. In particular, the present disclosure relates to a dynamic nameplate used on a circuit board.

2. Description of Related Art

The computer industry is becoming more and more developed. In addition to performance improvements, more and more computer manufacturers are focusing on cool appearances to attract consumers, for example, installing lighting on the housing of the computer or installing a nameplate on the motherboard to present an exquisite exhibition appearance.

Due to the narrow space inside the computer, for example, the height above the chip (PCH) on the motherboard is limited to 15 mm. Most nameplates are designed with a thin plate appearance and fixed on the motherboard by attaching and locking. Most of such presentations are static, and large components such as traditional motors cannot be added to achieve dynamic effects, thus they cannot give consumers more novel experiences.

SUMMARY

The present disclosure is to provide a dynamic nameplate, including: a base disposed on a circuit board; and a rotating member disposed on the base through a bearing, wherein the rotating member is rotated relative to the base.

The aforementioned dynamic nameplate further includes: a stator member disposed between the base and the rotating member, wherein the stator member is provided with a plurality of protrusions, and wherein each of the protrusions is respectively wound with a coil; and a rotor member disposed above the stator member and in contact with the rotating member and having a plurality of magnetic poles corresponding to the plurality of protrusions.

In the aforementioned dynamic nameplate, the coils around any two adjacent ones of the protrusions are wound in opposite directions, and any two adjacent ones of the magnetic poles are opposite in polarity.

In the aforementioned dynamic nameplate, the protrusions are at least six in number.

In the aforementioned dynamic nameplate, the rotor member is disposed in a groove of a surface of the rotating member facing the stator member.

In the aforementioned dynamic nameplate, the rotor member is embedded in the rotating member.

In the aforementioned dynamic nameplate, a surface of the rotating member facing the stator member has a plurality of openings to expose the rotor member.

In the aforementioned dynamic nameplate, the positions of the openings respectively correspond to the positions of the magnetic poles of the rotor member.

In the aforementioned dynamic nameplate, the rotating member is a disc or a gear.

The aforementioned dynamic nameplate further includes a fixing member configured for fixing the rotating member and the bearing onto the base.

BRIEF DESCRIPTION OF THE DRAWINGS

The present disclosure can be more fully understood by reading the following descriptions of the embodiments, with reference made to the accompanying drawings.

DETAILED DESCRIPTION

The following specific embodiments illustrate the implementation of the present disclosure, Those skilled in the art can easily understand the other advantages and effects of the present disclosure based on the contents disclosed in this specification, and can also implement or apply the present disclosure based on other different specific embodiments.

Figure 1:
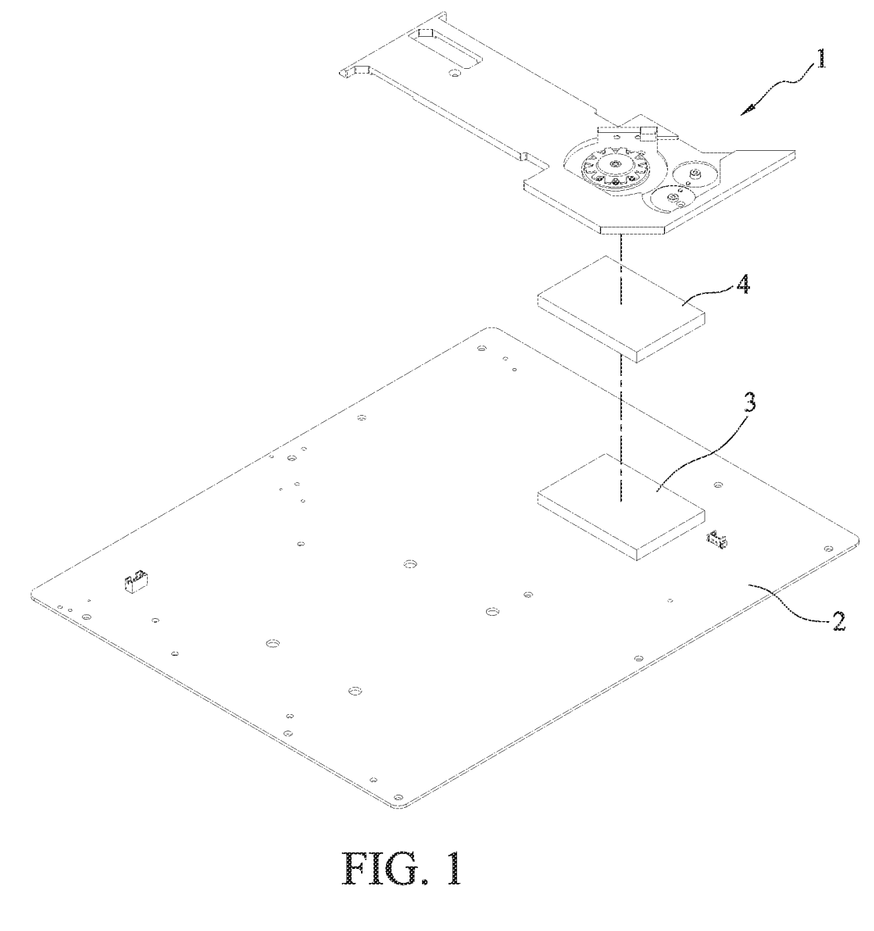
FIG. 1 is a schematic diagram of the assembly of a dynamic nameplate of the present disclosure.

Please refer to FIG. 1, the dynamic nameplate 1 of the present disclosure can be installed on the circuit board 2. For example, the dynamic nameplate 1 can be attached to the circuit board 2 through screw holes and screws. In an embodiment, the circuit board 2 can be a motherboard, and the dynamic nameplate 1 is mainly locked on an application interface 3 (such as M.2, PCH, VGA, I/O) of the motherboard. Further, a heat-conducting layer 4, such as a heat-dissipating paste or a silicon-type heat-conducting material pad, can be disposed between the application interface 3 and the dynamic nameplate 1.

Figure 2:
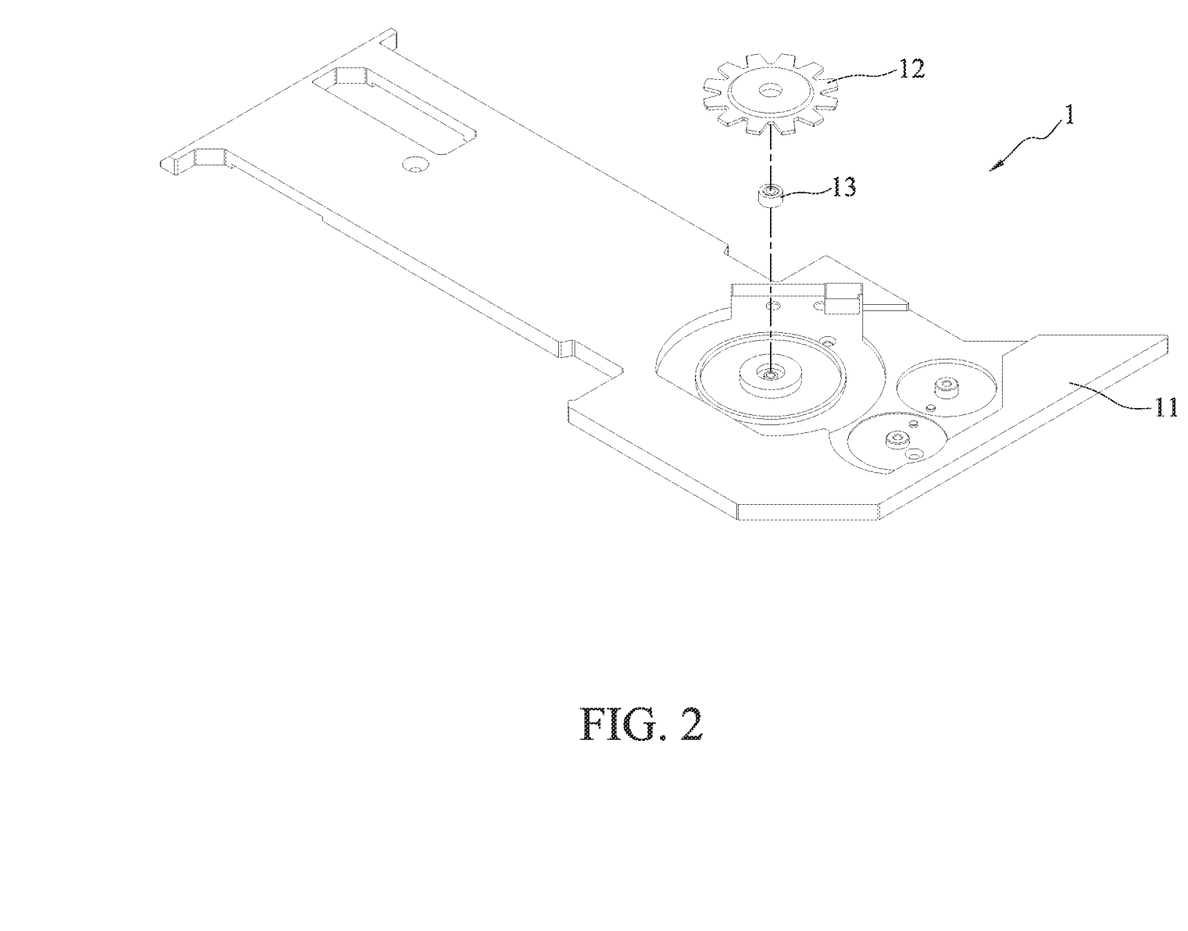
FIG. 2 is a schematic exploded diagram of the first embodiment of the dynamic nameplate of the present disclosure.

Please refer to FIG. 2, which is a schematic exploded diagram of the first embodiment of the dynamic nameplate of the present disclosure. The dynamic nameplate 1 of the present disclosure may include a base 11 and a rotating member 12. The base 11 can be disposed on the circuit board 2 (as shown in FIG. 1), and the rotating member 12 can be disposed on the base 11 (for example, riveted) through the bearing 13. In this way, the rotating member 12 can rotate relative to the base 11 on a fixed axis through the bearing 13.

Figure 3A:
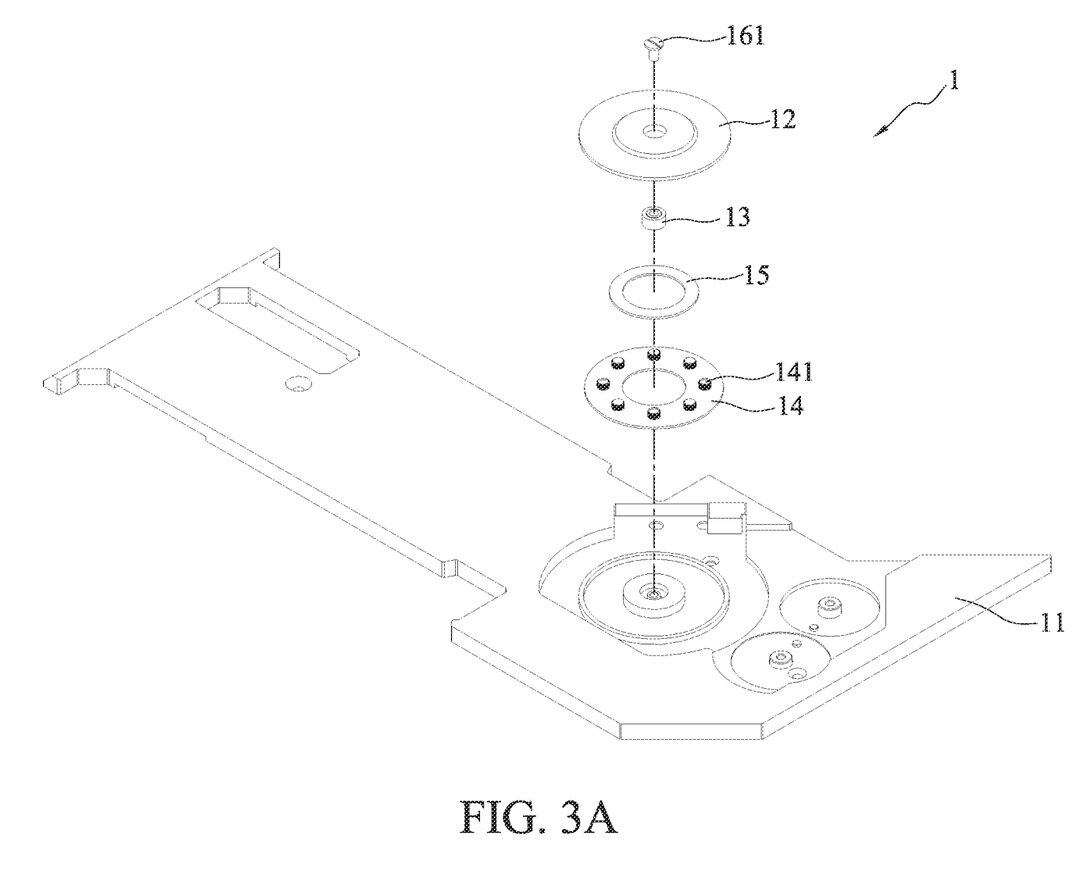
FIGS. 3A and 3B are schematic exploded diagrams from different perspectives of the second embodiment of the dynamic nameplate of the present disclosure.
Figure 3B:
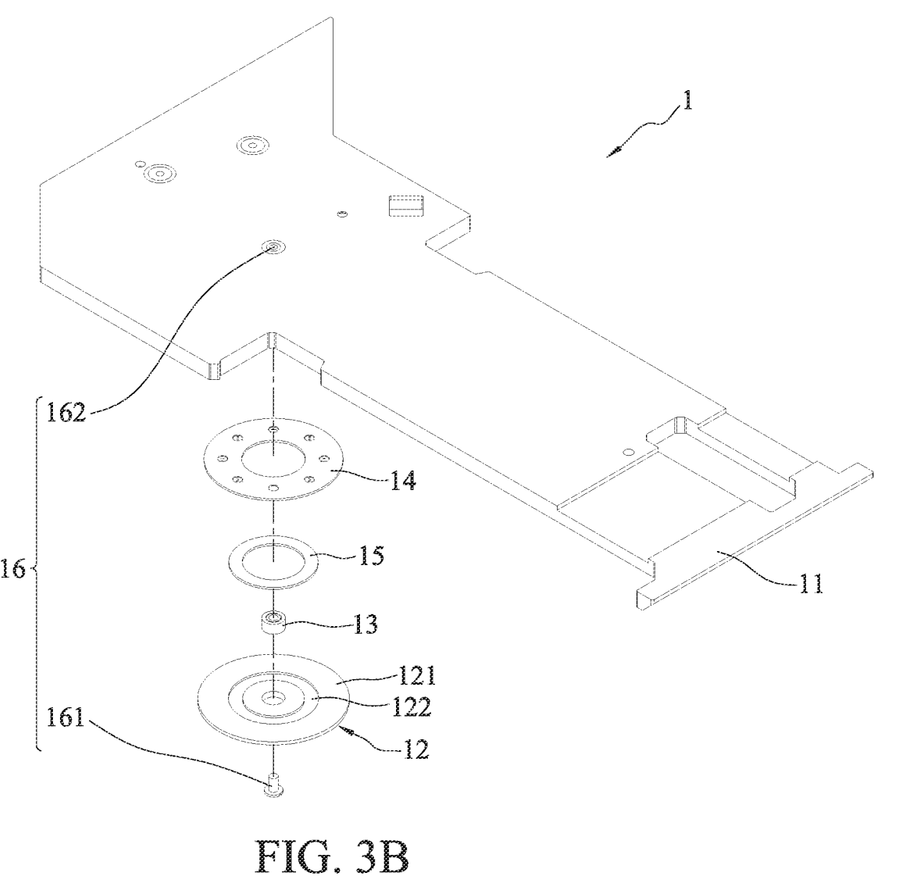

Please refer to FIGS. 3A and 3B, which are respectively schematic exploded diagrams from different perspectives of the second embodiment of the dynamic nameplate of the present disclosure. The difference between the second embodiment and the aforementioned first embodiment is that the dynamic nameplate 1 of the second embodiment further includes a stator member 14 and a rotor member 15. The stator member 14 is disposed between the base 11 and the rotating member 12, and the surface of the stator member 14 facing the rotating member 12 is provided with a plurality of protrusions 141, and the protrusions 141 are each wound with a coil. In addition, the stator member 14 is fixed on the base 11. Moreover, the rotor member 15 is disposed above the stator member 14 and is in contact with the rotating member 12, and the rotor member 15 has a plurality of magnetic poles corresponding to the plurality of protrusions 141.

Figure 4A:
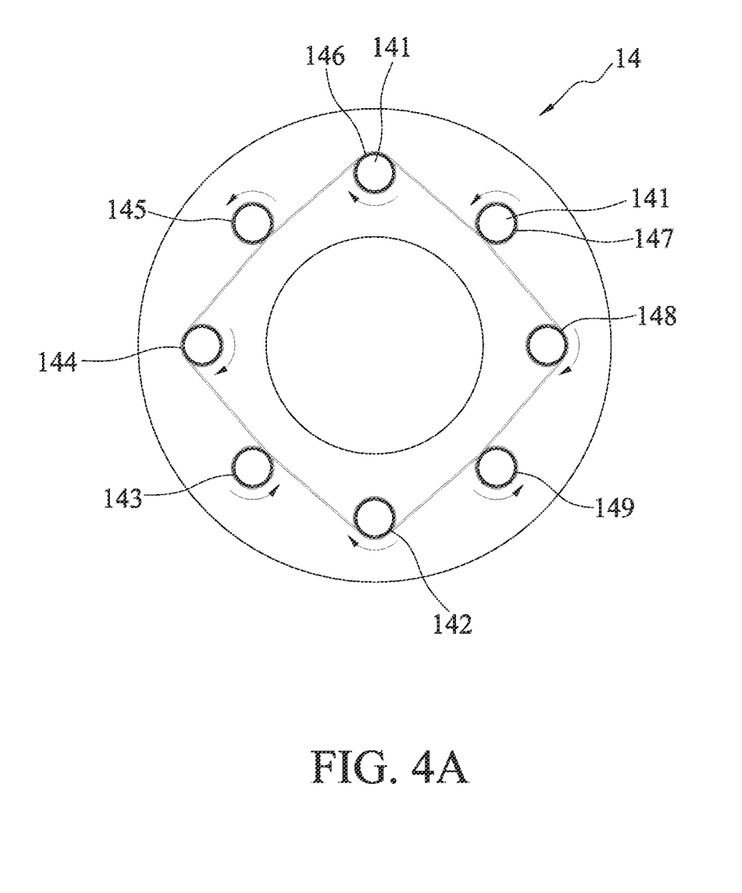
FIG. 4A is a schematic enlarged view of the stator member in FIGS. 3A and 3B.

In an embodiment, as shown in FIG. 4A, the coils 142, 143, 144, 145, 146, 147, 148 and 149 wound on the protrusions 141 of the stator member 14 respectively have specific winding directions. For example, the coils 142, 143, 144, 145, 146, 147, 148 and 149 around adjacent protrusions 141 are wound in opposite directions. Specifically, the coils 142, 144, 146 and 148 are wound clockwise, and the coils 143, 145, 147 and 149 are wound counterclockwise. In this way, after currents flow through the coils 142, 143, 144, 145, 146, 147, 148 and 149, the magnetic polarity of the coils 142, 144, 146, 148 and that of the coils 143, 145, 147, 149 will be opposite.

Figure 4B:
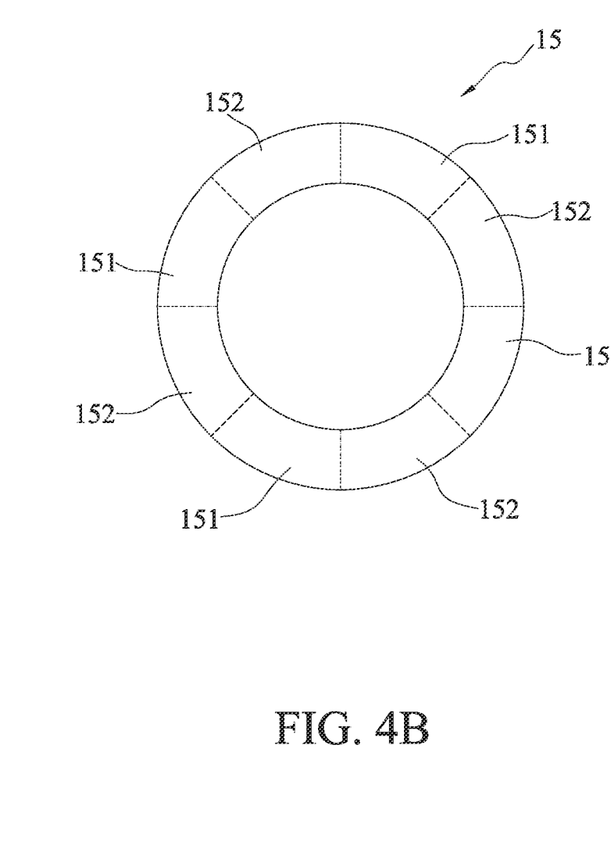
FIG. 4B is a schematic enlarged view of the rotor member in FIGS. 3A and 3B.

In an embodiment, among the magnetic poles 151 and 152 of the rotor member 15, adjacent magnetic poles have opposite magnetic polarities. As shown in FIG. 4B, if the magnetic pole 151 is positive, the magnetic pole 152 is negative, and vice versa.

In an embodiment, the number of the protrusions 141 may correspond to the number of the magnetic poles 151 and 152, or may not correspond to the number of the magnetic poles 151, 152. The number of the protrusions 141 must be at least six, the next better number is eight, preferably twelve, and most preferably sixteen, but the present disclosure is not limited thereto. The number of the magnetic poles 151 and 152 must be at least six, the next better number is eight, preferably twelve, and most preferably sixteen, but the present disclosure is not limited thereto.

As shown in the bottom view of the dynamic nameplate 1 in FIG. 3B, in an embodiment, the rotating member 12 has a groove 122 on a surface 121 facing the stator member 14, and the rotor member 15 can be embedded in the groove 122. For example, the rotor member 15 can be fixed in the groove 122 through an adhesion agent. In an embodiment, the rotor member 15 may be circular, and the groove 122 may also be a circular groove, but the present disclosure is not limited thereto. The rotor member 15 may also be square, elliptical, triangular, etc., and the shape of the groove 122 may correspond to the shape of the rotor member 15.

In the second embodiment of the dynamic nameplate 1 of the present disclosure, the rotating member 12, the bearing 13, the stator member 14, and the rotor member 15 can be fixed onto the base 11 through a fixing member 16. For example, the fixing member 16 can be a combination of a screw 161 and a nut 162. The screw 161 is on the side of the rotating member 12, and the nut 162 is on the side of the base 11. By screwing the screw 161 and the nut 162, the rotating member 12, bearing 13, the stator member 14 and rotor member 15 can be fixed on the base 11.

As mentioned above, the stator member 14 of the dynamic nameplate 1 of the present disclosure is fixed on the base 11, and the coils 142, 143, 144, 145, 146, 147, 148 and 149 wound around the protrusions 141 on the stator member 14 will assume different magnetic poles after currents flow through the coils. On the other hand, the rotor member 15 is fixed in the rotating member 12, and the rotor member 15 also has a plurality of different magnetic poles. Therefore, the magnetic force of the same poles repelling each other and the different poles attracting each other generated by the different magnetic polarities of the alternate N and S poles of the rotor member 15 and the coils of the stator member 14 with currents can rotate the rotating member 12 on the base 11 around the fixed axis of the bearing 13, thus the dynamic nameplate 1 of the present disclosure can generate dynamic effects.

Figure 5A:
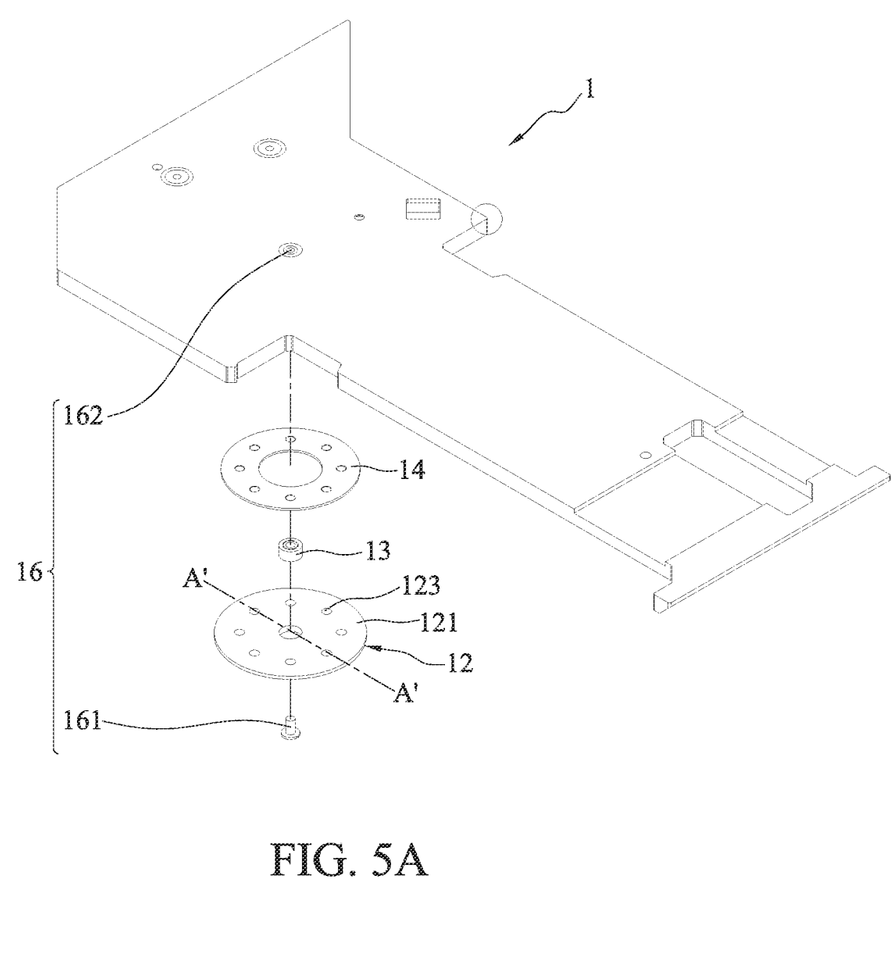
FIG. 5A is a schematic exploded diagram of the third embodiment of the dynamic nameplate of the present disclosure.
Figure 5B:
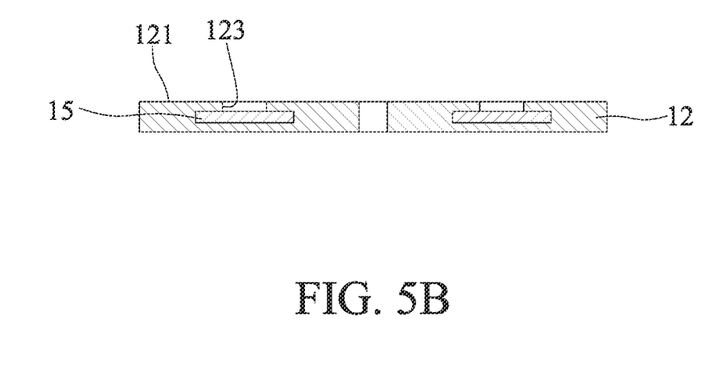
FIG. 5B is a schematic cross-sectional view taken along the line A'-A' in FIG. 5A.

Please refer to FIGS. 5A and 5B at the same time. FIG. 5A is a schematic exploded view of the third embodiment of the dynamic nameplate of the present disclosure, and FIG. 5B is a schematic cross-sectional view taken along the line A'-A' in FIG. 5A. The difference between the third embodiment and the aforementioned second embodiment lies in the arrangement of the rotor member 15. The following describes the difference, and the similarities between the third embodiment and the second embodiment will not be repeated.

In an embodiment, the rotor member 15 is embedded in the rotating member 12, and the surface 121 of the rotating member 12 facing the stator member 14 is provided with a plurality of openings 123, and the plurality of openings 123 can expose the rotor member 15. In addition, the positions of the openings 123 can respectively correspond to the positions of the plurality of magnetic poles 151 and 152 of the rotor member 15 (as shown in FIG. 4B). In other words, the number of the plurality of magnetic poles 151, 152 of the rotor member 15 may correspond to the number of the openings 123, or the plurality of magnetic poles 151, 152 of the rotor member 15 are separated from each other and are respectively disposed in the corresponding openings 123. For example, the shape of the plurality of magnetic poles 151 and 152 of the rotor member 15 separated from each other is the same or different from the shape of the openings 123, but the present disclosure is not limited thereto. The top surface of the rotor member 15 in various aspects of the present disclosure can be configured to be coplanar with the surface 121 of the rotating member 12, but the present disclosure is not limited thereto.

Figure 6:
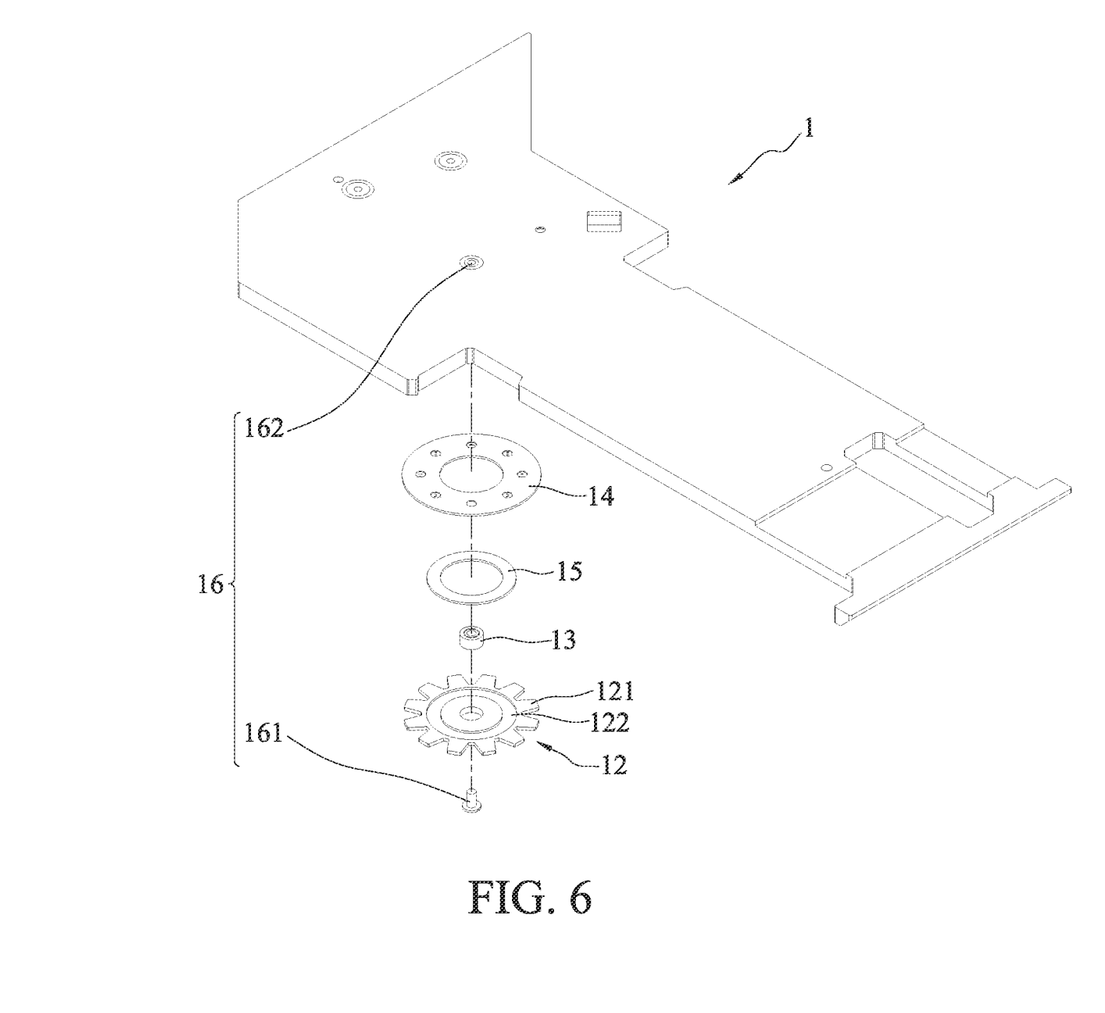
FIG. 6 is a schematic exploded diagram of the fourth embodiment of the dynamic nameplate of the present disclosure.
Figure 7:
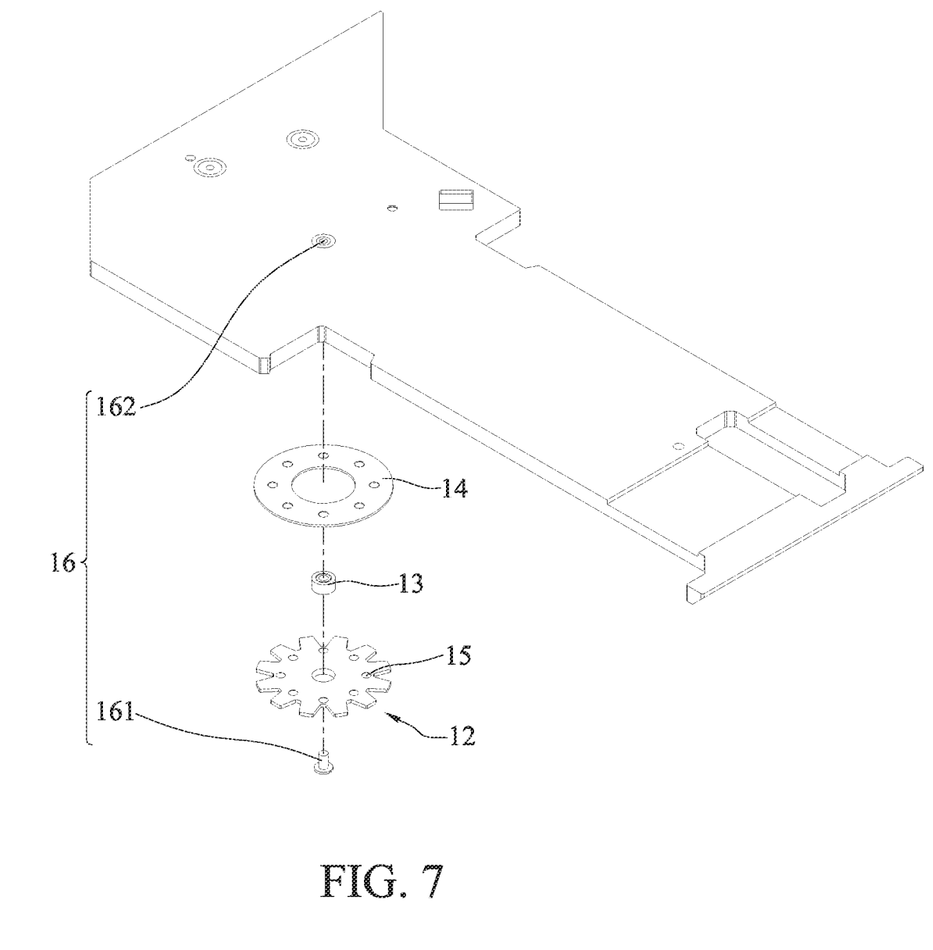
FIG. 7 is a schematic exploded diagram of the fifth embodiment of the dynamic nameplate of the present disclosure.

Please refer to FIG. 6, which is a schematic exploded diagram of the fourth embodiment of the dynamic nameplate of the present disclosure. Most of the technical features of this fourth embodiment are the same as those of the aforementioned second embodiment. The only difference is that the rotating member 12 of the second embodiment is a disc, while the rotating member 12 of the fourth embodiment is a gear. Please refer to FIG. 7, which is a schematic exploded diagram of the fifth embodiment of the dynamic nameplate of the present disclosure. Most of the technical features of the fifth embodiment are the same as those of the aforementioned third embodiment. The only difference is that the rotating member 12 of the third embodiment is a disc, while the rotating member 12 of the fifth embodiment is a gear. Regardless of the rotating member 12 being a disc as in the second and third embodiments or a gear as in the fourth and fifth embodiments, the present disclosure does not limit the shape and the structure of the rotating member 12. In addition, the dynamic nameplate 1 of the present disclosure can be provided with LED lights for an extended light effect appearance, and the LED lights can be disposed on the movable rotating member 12 to give consumers more novel experiences.

In summary, the magnetic force of the same poles repelling each other and the different poles attracting each other generated by the different magnetic polarities generated by the coils wound in different directions around the plurality of protrusions 41 of the stator member 14 of the dynamic nameplate 1 of the present disclosure cooperating with the different magnetic poles of the rotor member 15 can rotate the rotating member 12 on the base 11 around the fixed axis of the bearing 13, thus dynamic effects can be generated without installing a conventional motor. In addition, since the dynamic nameplate 1 of the present disclosure can provide dynamic effects without using a conventional motor, the dynamic nameplate 1 of the present disclosure can still maintain a thin profile. Therefore, the dynamic nameplate 1 of the present disclosure can still be effectively disposed in a narrow space such as inside a computer host.

The aforementioned embodiments are for illustrating the technical principles, features and effects of the present disclosure, and are not intended to limit the implementable scope of the present disclosure. Anyone skilled in the art can modify and change the aforementioned embodiments as long as the spirit and the scope of the present disclosure are not violated. However, any equivalent modifications and changes made by using the teachings of the present disclosure should still be covered by the following claims. The scope of protection of the rights of the present disclosure should be as listed in the following claims.

What is claimed is:

1. A dynamic nameplate, comprising:
   a base disposed on a circuit board;
   a rotating member disposed on the base through a bearing, wherein the rotating member is rotated relative to the base around an axis;
   a stator member disposed between the base and the rotating member, wherein a plurality of protrusions are protruded parallel to the axis from a surface of the stator member, and wherein each of the protrusions is respectively wound with a coil; and
   a rotor member disposed above the stator member and in contact with the rotating member and having a plurality of magnetic poles corresponding to the plurality of protrusions,
   wherein the rotor member is embedded in the rotating member,
   wherein a surface of the rotating member facing the stator member has a plurality of openings to expose the rotor member.

2. The dynamic nameplate of claim 1, wherein the coils around any two adjacent ones of the protrusions are wound in opposite directions, and wherein any two adjacent ones of the magnetic poles are opposite in polarity.

3. The dynamic nameplate of claim 1, wherein the protrusions are at least six in number.

4. The dynamic nameplate of claim 1, wherein positions of the openings respectively correspond to positions of the magnetic poles of the rotor member.

5. The dynamic nameplate of claim 1, wherein the rotating member is a disc or a gear.

6. The dynamic nameplate of claim 1, further comprising a fixing member configured for fixing the rotating member and the bearing onto the base.

\* \* \* \* \*